United States Patent [19]

Rossi et al.

[11] 3,961,277

[45] June 1, 1976

[54] FREQUENCY DEMODULATOR, ESPECIALLY FOR DATA-TRANSMISSION SYSTEM

[75] Inventors: Umberto Rossi, Milan; Pietro Basili, Pedaso, both of Italy

[73] Assignee: Societa Italiana Telecomunicazioni Siemens S.p.A., Milan, Italy

[22] Filed: Apr. 8, 1975

[21] Appl. No.: 566,130

[30] Foreign Application Priority Data

Apr. 8, 1974 Italy .................................. 21025/74

[52] U.S. Cl. ................................. 329/128; 329/107
[51] Int. Cl.² ........................................... H03D 3/20
[58] Field of Search ............ 329/126, 128, 102, 104, 329/107

[56] References Cited
UNITED STATES PATENTS

| 3,670,250 | 6/1972 | Fritkin | 329/126 |
| 3,761,809 | 9/1973 | Lockitt | 329/126 |

*Primary Examiner*—John Kominski
*Attorney, Agent, or Firm*—Karl F. Ross; Herbert Dubno

[57] ABSTRACT

To demodulate an incoming oscillation consisting of a succession of distinct signal frequencies, particularly in a data-transmission system using an alternation of two keying frequencies, the incoming oscillation is squared and then passed through a differentiator deriving a pair of closely spaced trigger pulses from any zero crossing of the incoming oscillation. The first trigger pulse causes the transfer of the contents of a buffer register, receiving the reading of a pulse counter, into a digital/analog converter whose output is compared with a reference voltage in a threshold circuit; the second trigger pulse resets the counter which receives locally generated clock pulses whose cadence is high compared to the signal frequencies.

7 Claims, 5 Drawing Figures

FREQUENCY DEMODULATOR, ESPECIALLY FOR DATA-TRANSMISSION SYSTEM

FIELD OF THE INVENTION

Our present invention relates to a frequency demodulator of the type used in a receiver for an incoming oscillation consisting of a succession of distinct signal frequencies, particularly (though not exclusively) in a data-transmission system using an alternation between a pair of such frequencies, commonly referred to as "keying frequencies," e.g. as disclosed in commonly owned U.S. Pat. No. 3,660,771.

BACKGROUND OF THE INVENTION

With each signal wave generally present for an interval spanning a multiplicity of cycles, the number of zero crossings of that wave within a given time interval is a measure of its frequency. Thus it is known to derive from such a wave, by differentiation, a train of pulses which can be converted into a binary wave of fixed pulse width or pulse spacing yielding, upon integration in a low-pass filter, an analog voltage alternating between two amplitude levels which represent a measure of the frequencies of the original signal waves upon being compared with a reference voltage.

In such a system, the output of the comparison circuit can be affected by fortuitous changes in the magnitude of the reference voltage. Thus, since the transitions of the analog voltage from one level to the other are gradual, such a shift in reference voltage may result in a distortion of the received message. The problem is aggravated, of course, in the presence of more than two signal frequencies.

OBJECT OF THE INVENTION

The object of our present invention, therefore, is to provide an improved frequency demodulator of the character set forth which eliminates this drawback.

SUMMARY OF THE INVENTION

In accordance with our present invention, the demodulator includes wave-shaping means for converting the incoming oscillation into a square wave and differentiation means for deriving from each discontinuity in the voltage of that square wave (i.e. from each zero crossing) a pair of closely spaced trigger pulses following each other within a small fraction of a cycle of the highest signal frequency to be demodulated. A pulse counter, stepped by a train of clock pulses whose cadence is high compared with this highest signal frequency, is connected to storage means for receiving its reading, the storage means being connected to the differentiation means for enablement by the first trigger pulse of each pair to transfer that reading to a digital/analog converter whereupon the second trigger pulse resets the pulse counter, immediately after each transfer, for the start of a new count. The digital/analog converter works into a threshold circuit which compares its output with a fixed reference voltage.

Such a digital/analog converter, unlike a low-pass filter, has a basic operating voltage whose magnitude remains constant within the degree of stability of its power supply. As long as that power supply is the same one that energizes the threshold circuit, the reference voltage of the latter bears a fixed relationship with the basic operating voltage of the converter so that any fluctuations in the power supply are balanced out in the final output signal.

In an advantageous embodiment described hereinafter, the differentiation means comprises logical circuitry connected to the source of clock pulses for deriving the first trigger pulse of each pair from the first clock pulse coinciding with any half-cycle of the incoming square wave. That logical circuitry may include a two-stage shift register with stage outputs connected to respective inputs of an Exclusive-OR gate feeding one pair of inputs of two coincidence (AND or NAND) gates, these gates having another pair of inputs connected to the source of clock pulses; an inverter inserted between the last-mentioned pair of inputs causes the appearance of trigger pulses in the outputs of these coincidence gates during successive halves of the first full clock cycle coinciding with any half-cycle of the square wave to be demodulated.

BRIEF DESCRIPTION OF THE DRAWING

The above and other features of our invention will now be described in detail with reference to the accompanying drawing in which.

SPECIFIC DESCRIPTION

Figure 1:
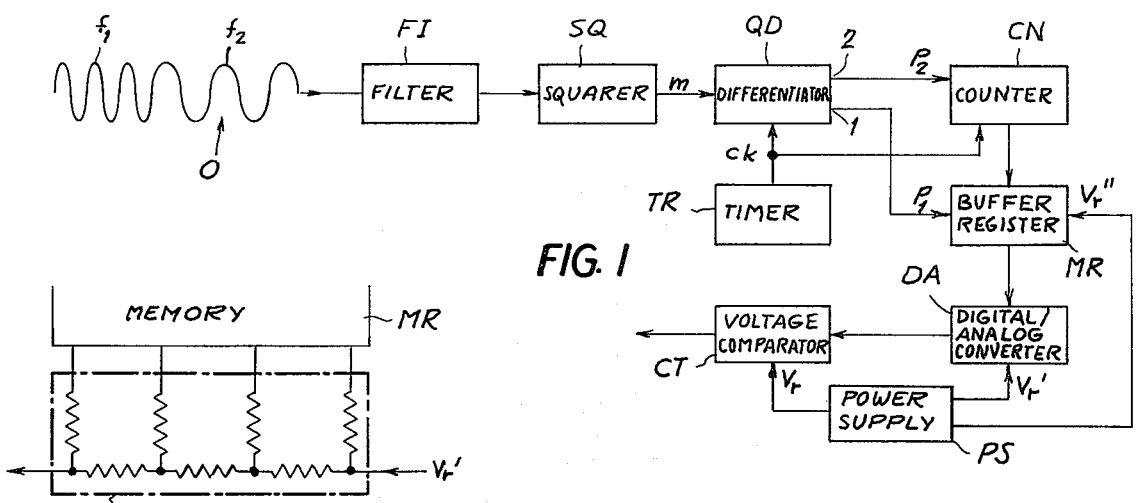
FIG. 1 is a block diagram of a demodulator embodying our invention.

In FIG. 1 we have shown a demodulator for an incoming oscillation O alternating between two keying frequencies $f_1$ and $f_2$ which may be one of several pairs of signal waves in different frequency ranges. An input filter FI, connected for example across a two-wire telephone line, passes these signal frequencies to a squarer SQ delivering a square wave $m$ (see also FIG. 3) to a differentiator QD with a pair of output leads 1 and 2. Output lead 1 terminates at a buffer register MR serving for the temporary storage of a binary word representing the reading of a pulse counter CN to which lead 2 is connected. A timer TR feeds a train of clock pulses $ck$, with a high cadence relative to the higher signal frequency $f_1$, to the differentiator QD and to the counter CN in parallel, the counter being stepped by these clock pulses. A trigger pulse $P_1$ on output lead 1 of differentiator QD serves to transfer the momentary reading of counter CN, continuously transmitted to buffer register MR, from that register to a digital/analog converter DA working into a voltage comparator CT, a trigger pulse $P_2$ on lead 2 serving to reset the counter CN promptly after each transfer. Such a resetting may result in a negative rather than a zero reading of the counter so that a zero count is reached, at or before the end of a period equaling a half-cycle of the higher signal frequency $f_1$, in response to a multiplicity of clock pulses $ck$ occurring within such a period.

Figure 4:
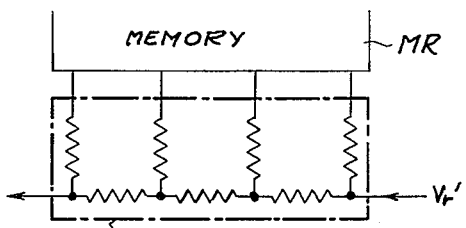
FIG. 4 is a circuit diagram of a digital/analog converter also forming part of the demodulator of FIG. 1.

A common power supply PS delivers a reference voltage $V_r$ to comparator CT and a related voltage $V_r'$ to the converter DA as a basic operating voltage therefor. The converter may comprise a network of weighted resistances, e.g. of the R/2R type, as illustrated in FIG. 4. Such a network forms a number of junctions which can be selectively connected to ground or some other fixed potential $V_r''$ also emanating from the power supply PS.

Figure 2:
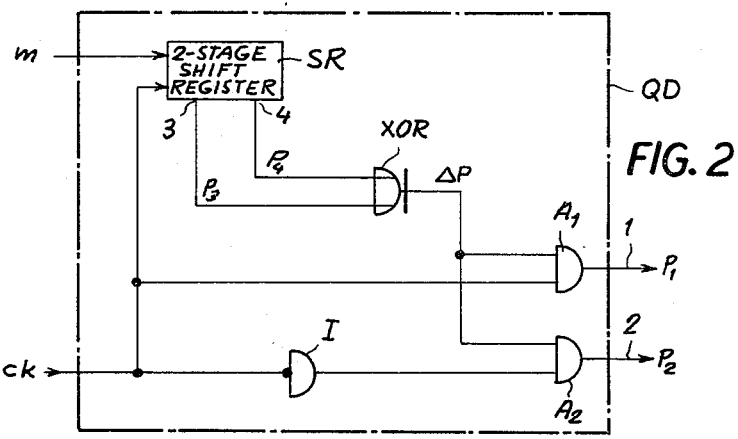
FIG. 2 is a circuit diagram of a differentiator included in the demodulator of FIG. 1.
Figure 5:
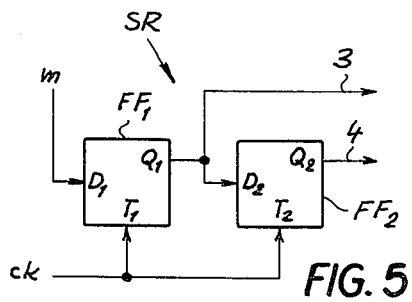
FIG. 5 is a more detailed representation of a shift register included in the differentiator of FIG. 2.

Reference will now be made to FIG. 2 showing the construction of differentiator QD according to a preferred embodiment. A two-stage shift register SR, shown in greater detail in FIG. 5, receives on the one hand the square wave $m$ from circuit SQ and on the other hand a clock pulse $ck$ from local timer TR to energize a pair of stage outputs 3 and 4 in relatively staggered relationship, as shown in graphs (a) and (b) of FIG. 3, with pulses $P_3$ and $P_4$ substantially equaling in length a half-cycle of square wave $m$. Thus, as shown in FIG. 5, shift register SR may comprise a pair of cascaded flip-flops $FF_1$ and $FF_2$ of the data type, square wave $m$ being fed to the data input $D_1$ of the first stage $FF_1$ whose output $Q_1$ reaches the data input $D_2$ of the second stage $FF_2$. With each of these flip-flops responsive to the leading edge of a positive clock pulse $ck$ applied to its respective trigger inputs $T_1$ and $T_2$, lead 3 connected to output $Q_1$ goes positive on the first clock cycle which coincides with a high voltage of square wave $m$ and primes the flip-flop $FF_2$ which on the next clock cycle energizes the lead 4 connected to its output $Q_2$.

Figure 3:
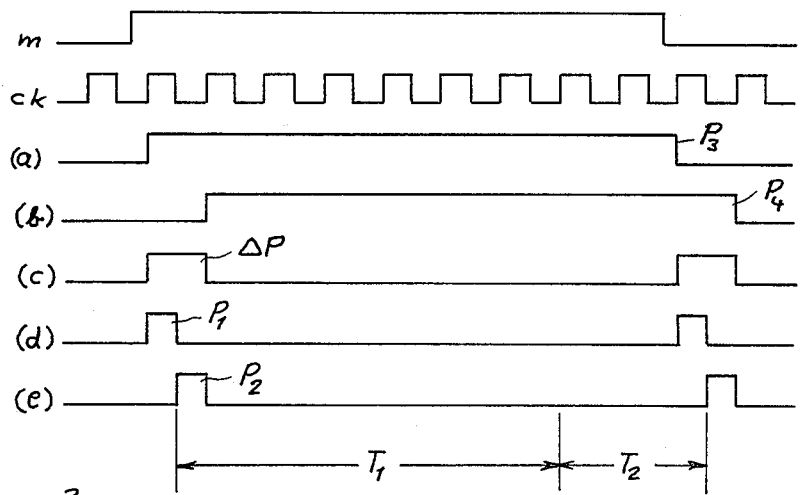
FIG. 3 is a set of graphs relating to the operation of the demodulator of FIG. 2.

As further shown in FIG. 2, leads 3 and 4 terminate at an Exclusive-OR gate XOR which generates an output pulse $\Delta P$, graph (c) of FIG. 3, during the period of non-overlap of pulses $P_3$ and $P_4$, i.e. immediately after the leading edge and the trailing edge of any half-cycle of square wave $m$. Pulse $\Delta P$ is delivered in parallel to a pair of AND gates $A_1$ and $A_2$ having the lines 1 and 2 as their output leads, gate $A_1$ receiving the clock pulses $ck$ directly whereas gate $A_2$ receives them by way of an inverter I. This opens the gate $A_1$ during the first (positive) clock pulse of each half-cycle of square wave $m$, with resulting generation of a trigger pulse $P_1$ according to graph (d) of FIG. 3, and therefore opens the gate $A_2$ during the gap immediately following that first clock pulse so as to generate the trigger pulse $P_2$ as shown in graph (e).

FIG. 3 also shows a period $T_1$ which may be equal to or somewhat less than the length of a half-cycle of square wave $m$ derived from the higher-frequency signal wave $f_1$; during a supplemental period $T_2$, terminating substantially at the end of that half-cycle if the incoming signal wave is of the lower frequency $f_2$, additional clock pulses $ck$ are counted. Thus, register MR receives a relatively low pulse count (possibly 0) in the presence of input frequency $f_1$ and a relatively high pulse count in the presence of input frequency $f_2$, with a correspondingly high degree of discrimination even between closely spaced frequencies and with a power of resolution determined by the cadence of the clock pulses.

The two-stage shift register SR of FIGS. 2 and 5 could also be replaced by a single flip-flop, with omission of gates XOR and $A_2$, if lead 2 is connected to lead 1 in the output of gate $A_1$ through a delay circuit causing the appearance of trigger pulse $P_2$ shortly after pulse $P_1$. The illustrated arrangement, however, insures a more precise relative timing of the two pulses.

Reference voltage $V_r$ is advantageously chosen equal to the mean output voltage of the converter DA, i.e. to a voltage which would be produced by a count of clock pulses $ck$ to about midway within the supplemental period $T_2$.

The described frequency demodulator can be readily adjusted to a wide range of signal frequencies and keying rates, e.g. in accordance with CCITT standards.

We claim:

1. A demodulator for an incoming oscillation including a succession of distinct signal frequencies, comprising:

wave-shaping means for converting said oscillation into a square wave;

differentiation means connected to said wave-shaping means for deriving from each discontinuity in the voltage of said square wave a pair of closely spaced trigger pulses following each other within a small fraction of a cycle of the highest signal frequency to be demodulated;

a source of clock pulses having a cadence which is high compared with said highest signal frequency;

a pulse counter connected to said source for stepping by said clock pulses;

storage means connected to said pulse counter for receiving the reading thereof;

a digital/analog converter connected to said storage means for energization by the contents thereof, said storage means being connected to said differentiation means for enablement by the first trigger pulse of each pair to transfer the reading of said pulse counter to said converter, said pulse counter being connected to said differentiation means for resetting by the second trigger pulse of each pair immediately after each transfer; and threshold means connected to said converter for comparing the output thereof with a fixed reference voltage.

2. A demodulator as defined in claim 1, further comprising a power supply connected to said threshold means for delivering said reference voltage thereto and further connected to said converter for providing same with a basic operating voltage related to said reference voltage.

3. A demodulator as defined in claim 2 wherein said converter comprises a network of weighted resistances.

4. A demodulator as defined in claim 1 wherein said differentiation means comprises logical circuitry connected to said source for deriving the first trigger pulse of each pair from the first clock pulse coinciding with any half-cycle of said square wave.

5. A demodulator as defined in claim 4 wherein said logical circuitry includes a two-stage shift register with respective stage outputs and an Exclusive-OR gate having input connections to said stage outputs.

6. A demodulator as defined in claim 5 wherein said logical circuitry further includes a pair of coincidence gates with one pair of inputs connected to said Exclusive-OR gate and another pair of inputs connected to said source, and inverter means inserted between said other pair of inputs.

7. A demodulator as defined in claim 1 wherein said pulse counter has a zero reading in response to a multiplicity of clock pulses occurring within a period equaling a half-cycle of said highest signal frequency.

* * * * *